United States Patent [19]
Parrillo et al.

[11] Patent Number: 4,717,683
[45] Date of Patent: Jan. 5, 1988

[54] CMOS PROCESS

[75] Inventors: Louis C. Parrillo, Austin, Tex.; Stephen J. Cosentino; Bridgette A. Bergami, both of Mesa, Ariz.

[73] Assignee: Motorola Inc., Schaumburg, Ill.

[21] Appl. No.: 910,927

[22] Filed: Sep. 23, 1986

[51] Int. Cl.[4] .................... H01L 21/22; H01L 21/265
[52] U.S. Cl. .......................... 437/34; 437/27; 437/29; 437/56; 437/57; 437/147; 437/148; 437/931; 437/933; 357/42
[58] Field of Search .............. 148/1.5; 29/571, 576 B, 29/576 W, 576 J; 357/23.3, 42; 148/DIG. 70

[56] References Cited

U.S. PATENT DOCUMENTS

| | | | |
|---|---|---|---|
| 4,277,291 | 7/1981 | Cerofolini | 148/1.5 |
| 4,295,266 | 10/1981 | Hsu | 29/571 |
| 4,306,916 | 12/1981 | Wollesen et al. | 148/1.5 |
| 4,412,375 | 11/1983 | Matthews | 29/576 B |
| 4,435,895 | 3/1984 | Parrillo et al. | 29/571 |
| 4,435,896 | 3/1984 | Parrillo et al. | 29/571 |
| 4,468,852 | 9/1984 | Cerofolini | 29/577 C |
| 4,554,726 | 11/1985 | Hillenius et al. | 29/576 B |
| 4,570,325 | 2/1986 | Higachi | 25/571 |
| 4,599,789 | 7/1986 | Gasner | 148/1.5 |
| 4,613,885 | 9/1986 | Haken | 29/576 B |

OTHER PUBLICATIONS

*IEEE Transa on Electron Devices*, vol.-31, No. 7, Jul. 1984, pp. 910–919, "Quadruple-Well CMOS for VLSI Technology", by John Y-T Chen.

*Primary Examiner*—Brian E. Hearn
*Assistant Examiner*—Chi-Tso Huang
*Attorney, Agent, or Firm*—John A. Fisher; Jeffrey V. Myers; James L. Clingan

[57] ABSTRACT

A process is disclosed for fabricating complementary insulated gate field effect transistors including doped field isolation regions and optional punch through protection. In one embodiment of invention, a silicon substrate is provided which has N-type and P-type surface regions. First and second masks are formed overlying active areas of the two surface regions. A third mask is then formed overlying the first region and the first mask. P-type impurities are implanted into the second region with an implant energy which is sufficient to penetrate through the second mask but insufficient to penetrate through the third mask. A second P-type implant is performed with an implant energy insufficient to penetrate through either mask. The first implant will aid in preventing punch through while the second implant dopes the field region. A fourth mask is then formed overlying the second region and the second mask. A first N-type implant is performed at energy sufficient to penetrate through the first mask but insufficient to penetrate through the fourth mask. This implant provides punch through protection for P channel transistors to be formed later. A second N-type impurity is implanted into the surface at an implant energy insufficient to penetrate through the first mask to provided field doping. The silicon substrate is then oxidized to form a field oxide at portions of the first and second surface regions which are not covered by the first and second masks.

10 Claims, 16 Drawing Figures

CMOS PROCESS

FIELD OF INVENTION

This invention relates generally to a process for forming semiconductor devices, and more particularly to a process for forming complementary insulated gate field effect transistors including doped field isolation regions.

BACKGROUND OF THE INVENTION

Trends in the semiconductor industry indicate a growing importance for devices of the complementary insulated gate field effect transistor (Complementary IGFET or CMOS) type. As used in integrated circuits, complementary IGFET devices, in turn, are decreasing in size and increasing in density. To successfully manufacture these devices requires a process which is easily manufacturable, provides adequate isolation between devices, and provides acceptably low leakage within each device.

Isolation between devices is achieved by providing a thick field oxide with a suitably doped region aligned beneath the thick oxide. The doped region is usually formed by ion implantation and must have a concentration of dopant which is carefully controlled to provide an acceptably high field threshold voltage without reducing the breakdown voltage of the junction formed between the doped region and an adjacent source or drain region to a value below the value of operating voltages used within the circuit.

As the size of the devices used in an integrated circuit are reduced further and further, the so called "short channel" effects begin to become important. As the channel length decreases, for a given operating voltage, punch through caused by the spread of the drain depletion region into the channel region becomes significant. Some protection against punch through is afforded by a subsurface increase, for example by ion implantation, in the doping of the device substrate beneath the channel region. The punch through protection implant is of the same doping type as the field enhancement implant, but is typically of a different magnitude and a different location within the device.

In addition to meeting electrical specifications, the integrated circuit must be commercially manufacturable. The ability to successfully manufacture an integrated circuit is enhanced by reducing the number of masking layers required to implement the process and by reducing the criticality of alignment of each masking layer. A process for fabricating a complementary IGFET circuit which will have the required physical and electrical characteristics and which will be useful in a manufacturing environment, therefore, requires steps for implementing doped field regions and, where needed, punch through protection. These must be implemented with a minimum of additional masking steps and with a minimum of critical masking steps.

It is therefore an object of this invention to provide an improved process for fabricating a complementary insulated gate field effect transistor circuit.

It is another object of this invention to provide an improved process for fabricating complementary IGFET devices having complementary doped field regions.

It is still another object of this invention to provide an improved process for fabricating semiconductor devices including doped field regions and punch through protection.

It is yet a further object of this invention to provide an improved process for fabricating semiconductor devices including non-compensating doped field regions with optional punch through protection.

SUMMARY OF THE INVENTION

The foregoing and other objects and advantages of the invention are achieved through a process in which a minimum number of masking layers are used in combination with multiple ion implantations. In accordance with one embodiment of the invention complementary insulated gate field effect transistors are fabricated by first providing a silicon substrate having first and second surface regions which are doped N-type and P-type, respectively. A first masking layer is formed overlying the two surface regions and is patterned to leave portions of the masking layer overlying the active regions of each of the first and second surface regions. P-type impurities are then implanted into those portions of both the first and second surface regions which are not covered by and protected by the patterned first masking layer. A second masking layer is formed overlying the P-type second surface region and N-type impurities are implanted into the surface at an implant energy which is sufficient to cause the implanted ions to penetrate through the first masking layer but not through the second masking layer. A second implant of N-type material is then performed into those portions of the first surface region which are not protected by the first masking layer. Isolation is completed by oxidizing the silicon substrate to form a field oxide at portions of the first and second surface regions which are not covered by the first masking layer. Fabrication of the complementary devices in the active regions then proceeds in the normal manner as, for example, with a standard silicon gate MOS process.

DETAILED DESCRIPTION OF PREFERRED EMBODIMENTS

FIGS. 1-15 illustrate schematically, in cross-section, a portion of a semiconductor substrate during the processing of that substrate in accordance with various embodiments of the invention.

Figure 1:
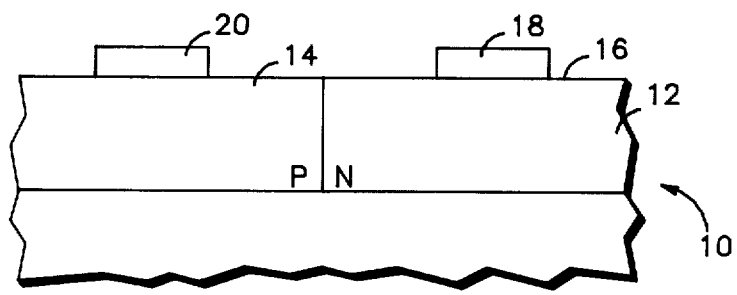
FIGS. 1-4 illustrate, in cross-section, process steps in accordance with one embodiment of the invention.

FIGS. 1-4 illustrate one such embodiment of the invention. FIG. 1 illustrates a semiconductor substrate 10 which has been processed in preparation for the fabrication of complementary insulated gate field effect transistors. The substrate includes a first region 12 having a surface of N-type conductivity and a second region 14 having a surface of P-type conductivity. In this embodiment the substrate is illustrated as being of the "twin well" type although the invention is equally applicable if the substrate is prepared with either a single N-type or a single P-type well. Overlying the upper surface 16 of substrate 10 is a patterned masking layer here illustrated to include masking portions 18,20. As will be described more fully below, the masking layer in a preferred embodiment, includes a thin layer of silicon dioxide in contact with surface 16 and an overlying layer of silicon nitride. The two masking portions 18,20 overlie what will become the active areas of the integrated circuit structure and leave exposed the field region of the circuit.

Figure 2:
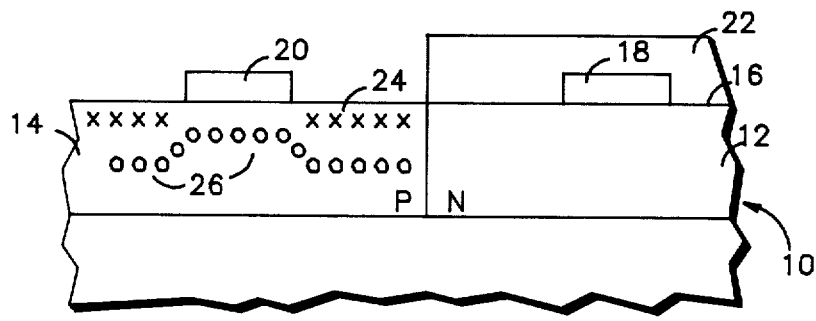
Figure 3:
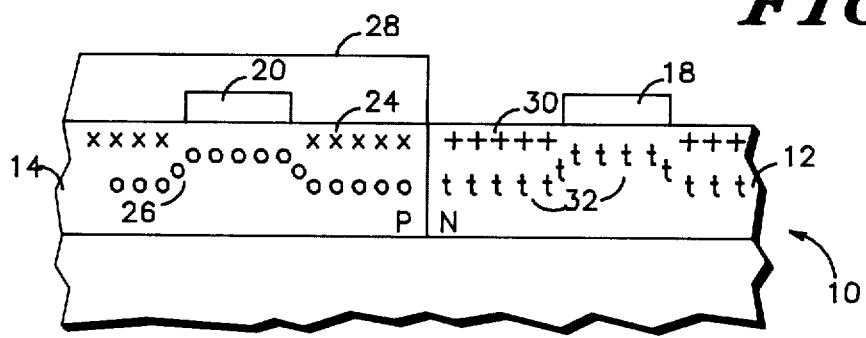

The processes continues is illustrated in FIG. 2 by applying an additional patterned masking layer 22 overlying region 12 having the surface of N-type conductivity and leaving region 14 exposed. Masking layer 22 can be, for example, a layer of patterned photoresist. Using the combination of the two masking layers 20,22, two P-type implants are performed into the surface of region 14. Ions of boron, BF$_2$, or the like are implanted into region 14 in two steps to provide an enhanced field doping and to provide punch through protection. The range of an implant describes the location of the peak of the implanted distribution. As is well known, the range is determined mainly by the energy (accelerating voltage) of the implant and by the material into which or through which the implant is performed. A first P-type impurity is implanted into region 14 at an implant energy which is low enough so that the implant is masked by both masking layers 20,22. This implant provides a shallow P-type region 24 as indicated by the x's near the surface of the region. A second P-type impurity is implanted at a sufficiently high energy so that the implanted ions penetrate through masking layer 20 and into the underlying silicon in P-type region 14. The implant energy is not sufficiently high, however, to penetrate masking layer 22, and the implant is thus restricted to region 14. The location of the second implant 26 is schematically illustrated by the o's. The second implant is preferably at a depth in the substrate such that after all subsequent heat treatment the implanted region is at approximately the junction depth of the device source and drain regions.

The first shallow P-type implant provides field doping to increase the threshold voltage in the field region and the second deeper implant increases the doping in the channel region and provides punch through protection. Masking layer 22 is then removed and an additional mask 28 is applied and patterned to cover the P-doped region 14, leaving region 12 exposed. Two N-type ion implantations are then performed to provide a doped field region and to provide punch through protection in a manner similar to that done with the P-type doping. The first N-type implant is done at an implant energy which is masked by both masking layers 18,28. The result is a shallow N-type implant 30 indicated by the +'s. The second N-type implant is done at a higher energy, sufficient to penetrate through masking layer 18 but insufficient to penetrate through masking layer 28. The second N-type implant increases the doping in the active area and specifically in the channel region to provide the desired punch through protection. The location of the second implant 32 is indicated schematically by the t's. Again, to maximize punch through resistance, the implanted region should be at approximately the source and drain junction depth.

Figure 4:
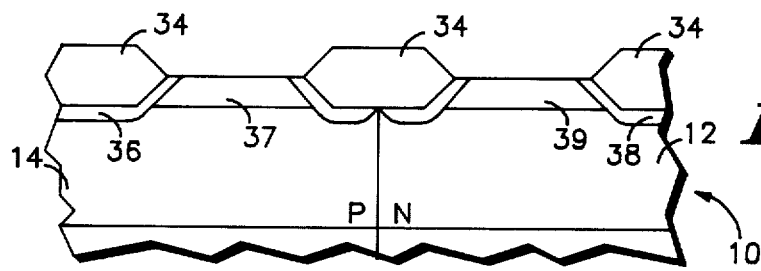

After removing mask layer 28, the silicon substrate is oxidized to grow a thick field oxide 34 at those portions of the surface of substrate 10 which are not protected by masking layers 18,20. The resulting structure is illustrated in FIG. 4. A region of enhanced P-type doping 36 underlies the thick field oxide in the P-doped region 14 and a region of enhanced N-type doping 38 underlies the thick field oxide in N-doped region 12. Punch through protection implants 37 and 39 are positioned below the substrate surface in the active areas of the device.

In accordance with a further embodiment of the invention, when punch through protection is not needed with the N channel devices to be formed in the P-type surface region, the process can be simplified and one masking operation eliminated. The process illustrated in FIGS. 5–7 depicts such an embodiment of the invention and includes many steps which are similar to those described above.

Figure 5:
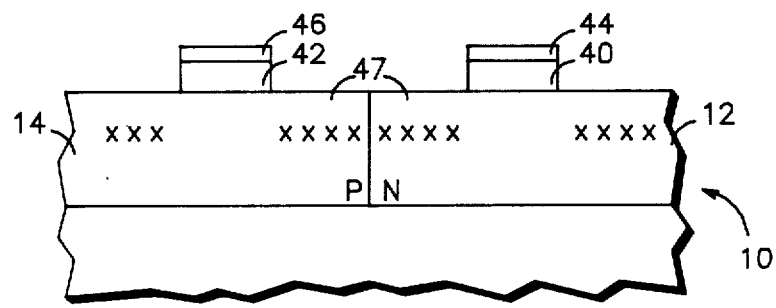
FIGS. 5-7 illustrate, in cross-section, process steps in accordance with a further embodiment of the invention.
Figure 6:
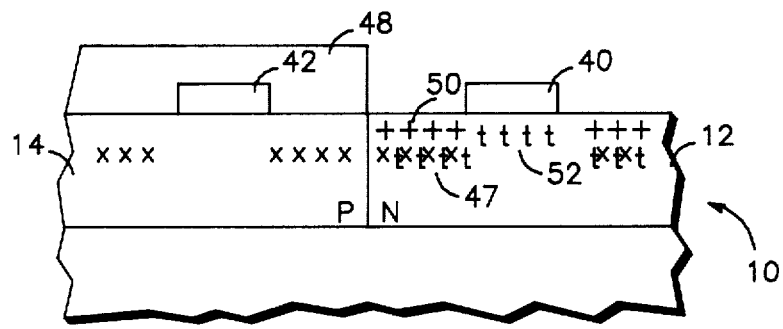

As illustrated in FIG. 5, the process begins, as above, with a silicon substrate 10 including complementary regions 12,14 haVing N and P-type doping at the surface thereof, respectively. A masking layer of, for example, a layer of silicon dioxide and an overlying layer of silicon nitride is formed on the surface of substrate 10. The oxide preferrably has a thickness of about 50 nanometers and the nitride preferably has a thickness of about 75 nanometers. The oxide can be thermally grown or can be deposited by CVD. The nitride layer is preferrably formed by CVD. A further layer of masking material such as conventional photoresist is formed overlying the silicon nitride. The photoresist is patterned in conventional manner and is subsequently used to pattern the nitride and oxide. The result is a patterned masking layer 40,42 of silicon oxide and silicon nitride with an overlying patterned layer of photoresist 44,46. These masking layers are positioned over what will be the active area of the integrated circuit to be formed. The composite masking layers of oxide, nitride, and photoresist are used as an ion implantation mask to mask a boron implant into the exposed portions of both region 12 and region 14. The boron is implanted at a sufficiently high energy, such as about 90 keV, so that the peak of the implant will be located below the surface of the silicon substrate. At that energy, for example, the implant will be peaked at about 0.33 micrometers below the surface. The location of implant 47 is indicated by the x's. Photoresist regions 44,46 which are used to pattern the underlying layers of silicon oxide and silicon nitride are retained on the surface during the ion implantation to insure that the high energy boron implant is adequately masked. Alternatively, the photoresist alone can be used as an implant mask and the implant can be performed through the layers of silicon oxide and silicon nitride before those layers are patterned. The implant is then performed at an energy of about 135 keV since it must penetrate the additional layers. The oxide and nitride are then patterned after the implant using the photoresist as an etch mask.

Following the boron implant, photoresist regions 44,46 are stripped from the wafer and a new layer of photoresist is applied and patterned to form a masking layer 48 which covers region 14 having a P-type doped surface. As with the previously described process, masking layer 48 is used in combination with masking layer 40 to selectively mask two N-type implants. A first, shallow N-type impurity, for example, phosphorus at an energy of about 30 keV, is implanted into the exposed surface of region 12. The implant energy is selected so that the implant is masked by both masking layer 40 and masking layer 48. The position of the shallow N-type implant 50 is indicated in FIG. 6 by the + signs. A second, deeper N-type impurity, for example phosphorus at an implant energy of 300 keV, is then implanted into the exposed portions of N-type region 12 and through masking layer 40. The implant energy is selected so that the implant penetrates through implant mask 40 and deposits the phosphorus material in the underlying semiconductor substrate, but the implant does not penetrate through the thicker masking layer 48. The implant energy selected depends, of course, on the thickness of the masking layer through which the ions must penetrate. The position of the resulting implant 52 is indicated by the t's. The same result is achieved by using doubly ionized phosphorus at a lower energy. A further alternative (not shown), when punch through protection is not needed, is to omit the second N-type implant.

Figure 7:
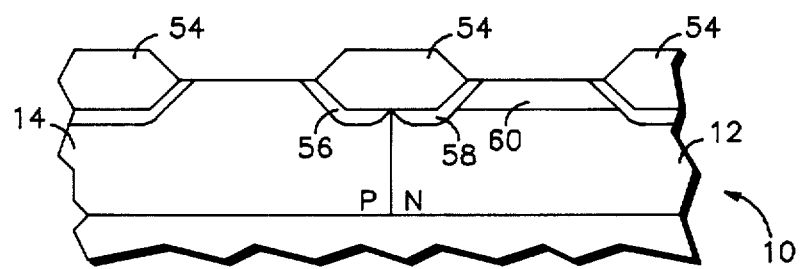
Figure 8:
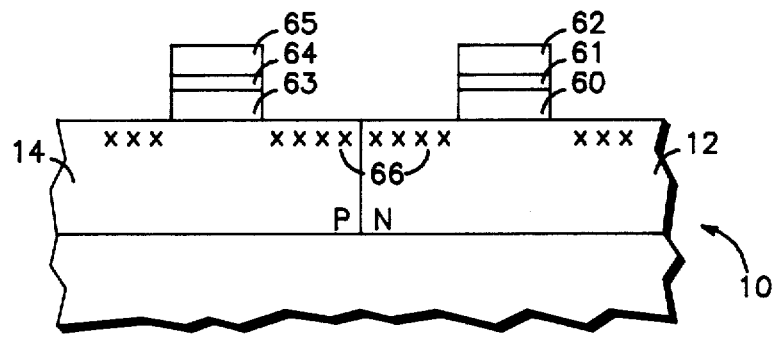
FIGS. 8-11 illustrate, in cross-section, process steps in accordance with a still further embodiment of the invention.

The silicon substrate is then heated in an oxidizing ambient to form a thick field oxide 54 as illustrated in FIG. 7. The field oxide can be grown, for example, by heating the substrate to about 1000° C. in an oxidizing ambient for a sufficient time to grow a thermal oxide having a thickness of about 0.7 micrometers. P-type implant 47 forms a P-type doped field region 56 beneath the thick field oxide in the P-type region 14. The shallow N-type implant 50 forms a doped field region 58 located beneath the thick field oxide in N-type region 12. The segregation coefficients of phosphorus and boron in silicon and silicon dioxide cause the phosphorus to pile up in the silicon and the boron to segregate into the oxide during the field oxide growth. The shallow phosphorus implant is thus able to overcompensate the boron layer in N-type region 12. The deeper N-type implant 52 also compensates for the P-type implant 47 which was located in N-type region 12 and forms a punch through protection region 60 which is located in the active portion of the N-type doped region 12. The structure illustrated in FIG. 7 is achieved with one less masking step than in the previous process, but has a compensated field region in N-type region 12 and has no punch through protection in P-type region 14.

FIGS. 8-11 illustrate a further embodiment of the invention. As above, a silicon substrate 10 is prepared by forming regions 12,14 having N and P-type doping at the surfaces thereof, respectively. Overlying the surface of substrate 10 are formed sequential masking layers which are patterned to retain the masking layers overlying what will become the active areas of regions 12,14. For example, overlying region 12 are sequential layers of silicon oxide and silicon nitride 60 (as above), silicon dioxide 61, and photoresist 62. In similar manner overlying region 14 are sequential layers of silicon oxide and silicon nitride 63, silicon oxide 64, and photoresist 65. The photoresist is used to pattern the underlying layers and then is retained as part of the ion implantation mask.

The composite masking layers are used as an ion implantation mask to mask a shallow implant of P-type impurity into the exposed portions of the surface of substrate 10. The location of the P-type implant 66, indicated by the x's, is preferrably at a depth in the silicon substrate of about 0.07 micrometers. The implant can be performed, for example, using singly ionized boron implanted at an energy of about 20 keV with a dose of about $2 \times 10^{13}$ cm$^{-2}$ or singly ionized boron diflouride implanted at an energy of about 90 keV and a dose of about $2 \times 10^{13}$ cm$^{-2}$.

Figure 9:
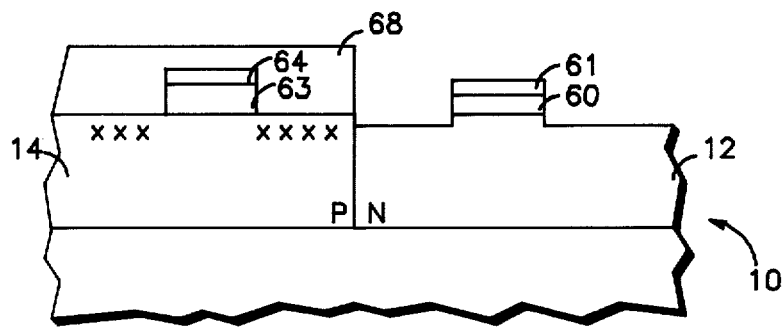

After the implantation, the photoresist masking material 62, 65 is removed and a further masking layer 68 of photoresist is applied and patterned to overlie region 14. The photoresist 68 is used in combination with masking layers 60,61 as an etch mask to etch away the surface of region 12 and thereby to etch away most or all of the boron doping which was implanted into that surface. The surface can be etched, for example, to a depth of about 50 nanometers using a chlorine containing plasma etchant in a conventional dry etching apparatus. During the etching, the silicon oxide layer 61 protects the underlying silicon nitride. The result of this etching step is illustrated in FIG. 9.

Figure 10:
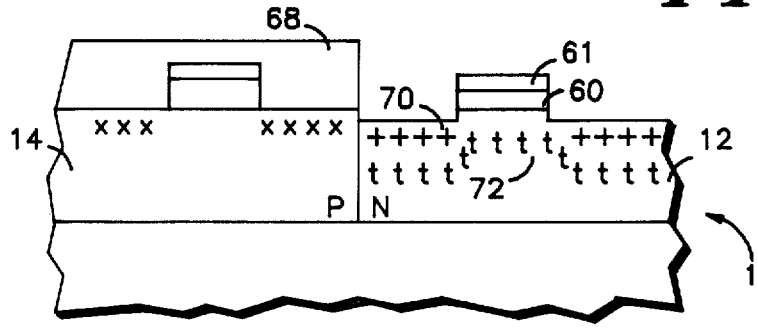

As illustrated in FIG. 10, the process proceeds as before by implanting shallow and deep N-type dopants into region 12 using masking layers 60,61 and 68 to selectively mask the implants. A shallow implantation of phosphorus or arsenic 70, illustrated by the +'s, is implanted at an energy insufficient to penetrate through masking layers 60 and 61. A second N-type implant 72 is carried out at an energy sufficient to penetrate through masking layer 60,61 but not through masking layer 68. The resulting implant 72 is illustrated by the t's.

Because of the etching step, the two field regions are implanted with N-type and P-type dopants, respectively, and the N-doped region 12 is provided with a punch through protection implant, all accomplished essentially without compensation. That is, there is essentially no compensation between N-type and P-type field dopant implants because most of the P-type implant is removed by etching.

Figure 11:
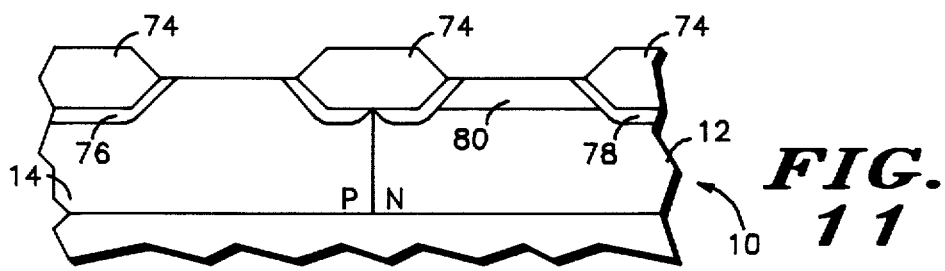

As above, the process is continued as illustrated in FIG. 11 by thermally oxidizing the silicon substrate 10. The oxidation grows a thick field oxide 74 which is aligned with a doped field region 76 in region 14 and by a doped field region 78 in region 12. A doped punch through protection region 80 is located within the active area of N-type region 12.

Figure 12:
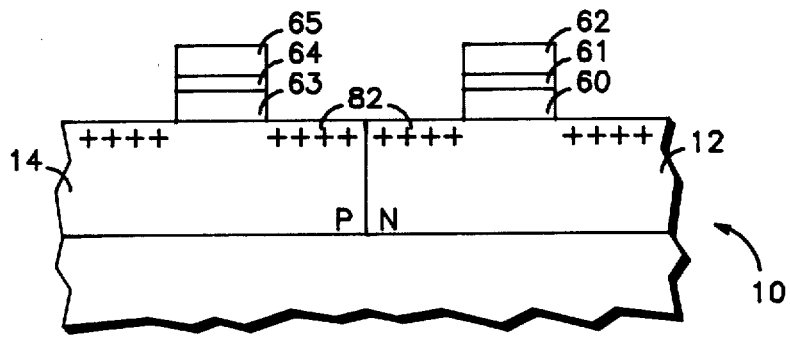
FIGS. 12-15 illustrate, in cross-section, process steps in accordance with yet another embodiment of the invention.

A still further embodiment of the invention is illustrated in FIGS. 12-15. This embodiment provides non-compensating field implants together with punch through protection for the N-channel transistors. The process begins, as illustrated in FIG. 12, in a manner similar to that used in the previous embodiment. A silicon substrate 10 is provided having regions 12 of N-type conductivity and regions 14 of P-type conductivity. Overlying the surface of the substrate are patterned masking layers 60–65 as before. The exposed surface of the substrate is then ion implanted with an N-type conductivity determining dopant, preferrably either phosphorus or arsenic. Doped region 82, indicated by the +'s, is located within about 40 nanometers of the surface of the substrate. For example, the doped region can be formed by the ion implantation of arsenic at an implantation energy of 40 keV with an implant dose of $2 \times 10^{12}$ cm$^{-2}$.

Figure 13:
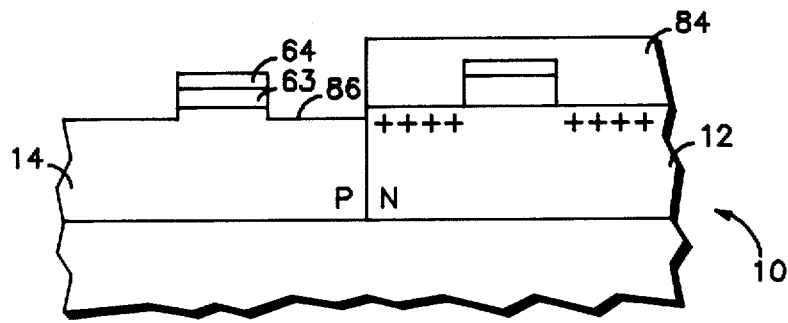

As illustrated in FIG. 13, masking layers 62,65 are removed and a new masking layer 84 is applied and patterned to form a mask over the N-type region 12. Using mask 84 together with mask 63,64, the exposed surface of region 14 is etched to a depth of about 50 nanometers as indicated at 86 to remove most or all of the N-type dopant material implanted there. During the etching of the silicon, oxide layer 64 protects the top surface of nitride layer 63.

Figure 14:
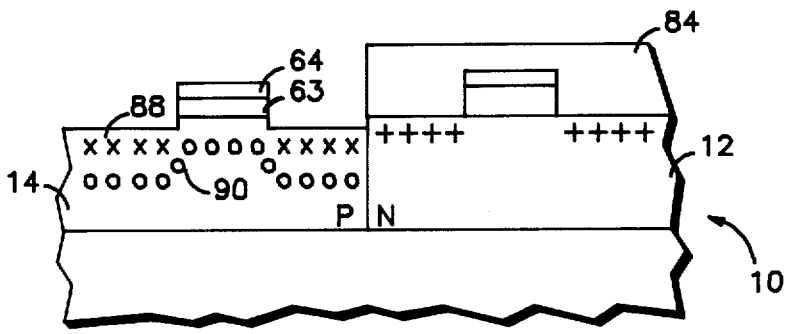

The process is continued, as illustrated in FIG. 14, by one or two implantations of P-type dopant impurity.

The first 88 is a shallow implantation 88 of boron or BF$_2$ as indicated by the x's.

This implant of boron is done, for example, at an implant energy of 15 keV and with a dose of $2 \times 10^{13}$ cm$^{-2}$. The implant energy is low enough so that the implantation is masked by masking layer 63,64. A second implant 90 is a more energetic implant which locates boron in P-type region 14 at the locations indicated by the o's. The second implant can be, for example, singly ionized boron at an implant energy of 120 keV and with an implant dose of $3 \times 10^{11}$ cm$^{-2}$. This implant energy is sufficient to penetrate through masking layer 63,64, but not through masking layer 84. In this manner heavily doped field regions are implanted for both N-channel and P-channel transistors without compensation and, in addition, punch through protection is provided for the N-channel transistors to be formed in region 14. If the punch through protection is not needed, the second N-type implant can be omitted.

Figure 15:
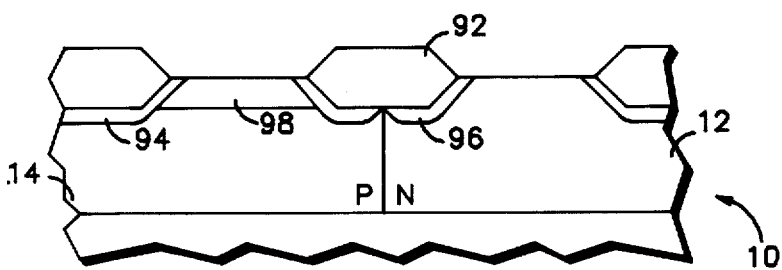

Following the P-type implants, masking layer 84 is removed from the surface of substrate 10 and the substrate is heated in an oxidizing ambient to grow a thick field oxide 92 as illustrated in FIG. 15. The process provides for the self-aligned orientation of P-doped field regions 94 beneath the thick field oxide in the P-well region and N-doped field regions 96 aligned beneath the thick field oxide in the N-region. In addition, as needed, a P-doped region 98 is located within the active device portion of the P-type region to provide punch through protection.

Figure 16:
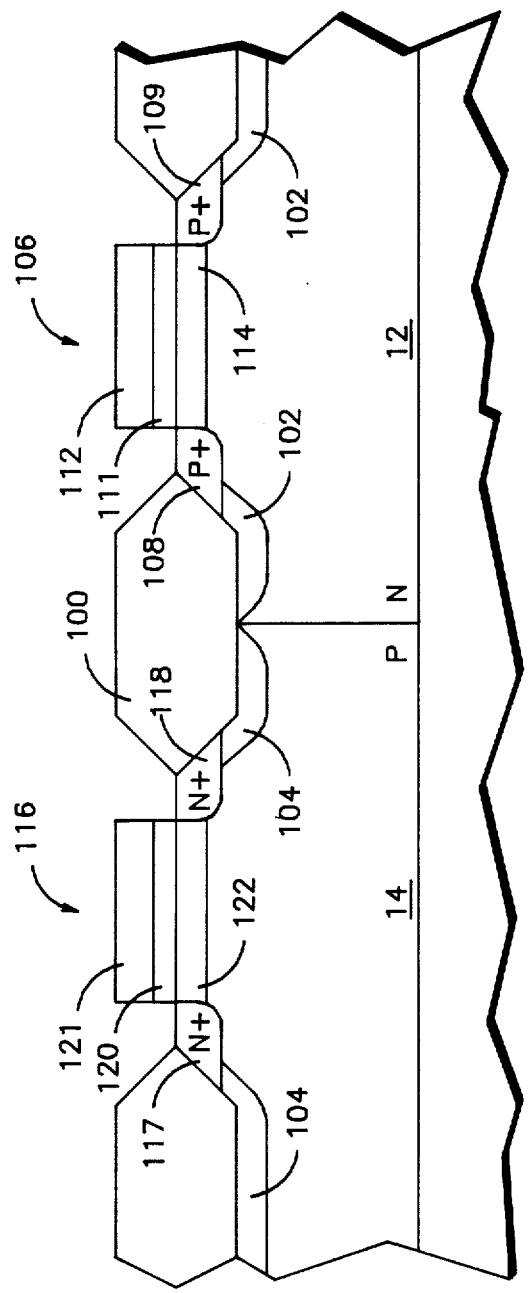
FIG. 16 illustrates, in cross-section, a partially completed complementary insulated gate field effect transistor structure in accordance with the invention.

With any of the foregoing embodiments of the invention, the structure as obtained and as illustrated in FIGS. 4, 7, 11, or 15 is used in conventional manner to form complementary insulated gate field effect transistors as illustrated in FIG. 16. In FIG. 16 a device is illustrated which includes a region 12 having an N-doped surface, a region 14 having a P-doped surface, and a thick field oxide 100. Enhanced N-type regions 102 underlie the thick field oxide in region 12 and enhanced P-type regions 104 underlie the thick field oxide in region 14. P-channel transistor 106 includes P-doped source region 108 and drain region 109. A gate structure includes a gate insulator 111 and a gate electrode 112. An enhanced punch through protection region 114 underlies the gate structure. N-channel transistor 116 includes N-type drain 117 and source 118, a gate structure including a gate insulator 120 and a gate electrode 121. Underlying the gate structure is a punch through protection region 122.

Thus it is apparent that there has been provided, in accordance with the invention, a process for the fabrication of device structures having doped field regions which fully meets the objects and advantages set forth above. Although the invention has been described and illustrated with reference to specific embodiments thereof, it is not intended that the invention be limited to these illustrative embodiments. Those skilled in the art will recognize, after review of the foregoing detailed description, that variations and modifications are possible which depart from these embodiments without departing from the invention. For example, the order of the implantations indicated in the illustrative embodiments can be interchanged. Likewise, other insulators than those specified, other implant energies and doses, and the like can be employed. Thus it is intended to encompass within the invention all such variations and modifications as fall within the scope of the appended claims.

We claim:

1. A process for fabricating complementary insulated gate field effect transistors including doped field isolation regions which comprises the steps of:
   providing a silicon substrate having an N-type first surface region and a P-type second surface region;
   forming first and second masks overlying active areas of said first and second surface;
   forming a third mask overlying said first region and said first mask;
   implanting first P-type impurities into said second region with an implant energy sufficient to penetrate through said second mask but insufficient to penetrate through said third mask;
   implanting second P-type impurities into said second region with an implant energy insufficient to penetrate through said second mask;
   forming a fourth mask overlying said second region and said second mask;
   implanting first N-type impurities into said first region with an implant energy sufficient to penetrate through said first mask but insufficient to penetrate through said fourth mask;
   implanting second N-type impurities into said first region with an implant energy insufficient to penetrate through said first mask;
   and oxidizing to form a field oxide at portions of said first and second surface regions not overlaid by said first and second masks.

2. A process for fabricating complementary insulated gate field effect transistors including doped field isolation regions which comprises the steps of:
   providing a silicon substrate having an N-type first surface region and a P-type second surface region;
   forming a first masking layer overlying said first and second surface regions;
   patterning said first masking layer to leave portions overlying an active region of each of said first and second surface regions;
   implanting P-type impurities into portions of said first and second regions not protected by said first masking layer;
   forming a second masking layer overlying said second surface region;
   implanting first N-type impurities into said first surface region at an implant energy sufficient for said first N-type impurities to penetrate through said first masking layer;
   implanting second N-type impurities into said first surface not protected by said first masking layer;
   and oxidizing to form a field oxide at portions of said first and second surface regions not overlaid by said first masking layer.

3. A process for fabricating complementary insulated gate field effect transistors including doped field isolation regions comprising the steps of:
   providing a silicon substrate having an N-type first surface region and a P-type second surface region;
   providing a patterned first masking layer overlying selected areas of each of said first and second surface regions, respectively;
   implanting P-type impurities into portions of said first and second surface region not masked by said first masking layer;
   forming a second masking layer overlying said second surface region;
   etching portions of said first surface region not protected by said first or second masks;

implanting N-type impurities into said first surface region using said first and second masking layers as implant masks;

and thermally oxidizing to form a field oxide at portions said first and second surface regions.

4. The process of claim 3 further comprising the step of implanting second P-type impurities into said second surface regions at an implant energy sufficient for said impurities to penetrate through said first masking layer but insufficient to penetrate through said second masking layer.

5. A process comprising the steps of:

providing a silicon substrate having a surface, said surface having a first region of N-type conductivity and a second region of P-type conductivity;

forming a first masking layer selectively overlying said first and second regions;

implanting P-type impurity ions into said surface using said first masking layer as an implant mask;

forming a second masking layer overlying said second region;

etching said surface using said first and second masks as an etch mask;

implanting first N-type impurity ions into said surface using said first and second masking layers as an implant mask;

implanting second N-type impurity ions into said surface using said second masking layer as an implant mask;

and selectively oxidizing said surface to form a field oxide.

6. A process for fabricating complementary insulated gate field effect transistors comprising the steps of:

providing a silicon substrate having a first region having a surface of first conductivity type and a second region having a surface of second conductivity type;

forming a first masking layer overlying said substrate;

forming a second patterned masking layer overlying said first masking layer and including masks over portions of each of said first and second regions;

implanting impurities of said second conductivity type into said substrate using said masks as ion implantation masks;

patterning said first masking layer using said masks as etch masks;

forming a third patterned masking layer overlying said second region;

implanting first and second impurities of first conductivity type, said first impurities implanted at an implant energy sufficient for said first impurities to penetrate said masking layer but not said third masking layer and said second impurities implanted at an implant energy such that said second impurities are masked by said first and third masking layers;

and oxidizing said substrate to form a field oxide.

7. A process for fabricating complementary insulated gate field effect transistors comprising the steps of:

providing a silicon substrate having a first conductivity type and a second region with a surface of second conductivity type, each of said first and second regions including active portion and field portions;

forming a first masking layer overlying said substrate;

selectively implanting ions of first conductivity type into said field portions of said first and second regions;

selectively etching said field portion of said second region to remove substantially all of said ions of first conductivity type implanted therein;

selectively implanting ions of second conductivity type into said field portion of said second region using said first masking layer as an implantation mask;

and oxidizing said substrate to form a field oxide.

8. The process of claim 7 further comprising the steps of:

forming a patterned layer of photoresist overlying said first masking layer;

using said photoresist as an implantation mask for said step of implanting ions of first conductivity type;

and etching said first masking layer using said photoresist as an etch mask.

9. The process of claim 7 further comprising the steps of:

forming a patterned layer of photoresist overlying said first masking layer;

etching said first masking layer;

and using said photoresist and first masking layer as an implantation mask for said step of implanting ions of first conductivity type.

10. The process of claim 7 further comprising the step of selectively implanting second ions of second conductivity type through said first masking layer and into said active portion of said second region.

* * * * *

UNITED STATES PATENT AND TRADEMARK OFFICE
CERTIFICATE OF CORRECTION

PATENT NO. : 4,717,683

DATED : 01/05/88

INVENTOR(S) : Louis Carl Parrillo et al.

It is certified that error appears in the above-identified patent and that said Letters Patent is hereby corrected as shown below:

In claim 6, column 10, line 4, before masking, insert --first--.

Signed and Sealed this

Seventh Day of June, 1988

Attest:

DONALD J. QUIGG

Attesting Officer      Commissioner of Patents and Trademarks